United States Patent
Ueki

(10) Patent No.: US 7,336,688 B2
(45) Date of Patent: Feb. 26, 2008

(54) SURFACE EMITTING SEMICONDUCTOR LASER AND METHOD OF MANUFACTURING THE SAME

(75) Inventor: Nobuaki Ueki, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 458 days.

(21) Appl. No.: 10/703,574

(22) Filed: Nov. 10, 2003

(65) Prior Publication Data
US 2004/0184498 A1    Sep. 23, 2004

(30) Foreign Application Priority Data
Mar. 18, 2003   (JP) .............................. 2003-074511

(51) Int. Cl.
*H01S 5/00* (2006.01)
(52) U.S. Cl. .............................. 372/45.01; 372/43.01; 372/50.124
(58) Field of Classification Search ............. 372/43.01, 372/45.01
See application file for complete search history.

(56) References Cited

U.S. PATENT DOCUMENTS

| | | | |
|---|---|---|---|
| 5,343,487 A | | 8/1994 | Scott et al. |
| 5,557,626 A | * | 9/1996 | Grodzinski et al. ...... 372/45.01 |
| 5,956,363 A | * | 9/1999 | Lebby et al. .......... 372/46.013 |
| 2002/0075921 A1 | * | 6/2002 | Kitatani et al. ................ 372/45 |
| 2006/0261352 A1 | * | 11/2006 | Takahashi et al. ............ 257/79 |

FOREIGN PATENT DOCUMENTS

| | | |
|---|---|---|
| JP | 09-205250 A | 8/1997 |
| JP | A 11-145560 | 5/1999 |
| JP | 2000-49416 A | 2/2000 |
| JP | 2001-85789 A | 3/2001 |
| JP | A 2001-135890 | 5/2001 |

OTHER PUBLICATIONS

Kenichi IGA, "Semiconductor Laser", Ohmsha, 1990. pp. 164-167, 396.

* cited by examiner

*Primary Examiner*—Michael Dung Nguyen
(74) *Attorney, Agent, or Firm*—Oliff & Berridge, PLC

(57) ABSTRACT

A surface emitting semiconductor laser includes a substrate, a first semiconductor multiple layer reflecting mirror formed on the substrate, the reflecting mirror having a semiconductor layer including at least Ga, In and P, an active region formed on the first semiconductor multiple layer reflecting mirror, a second semiconductor multiple layer reflecting mirror formed on the active region, a current confining layer formed between the first and second multiple layer reflecting mirrors, the current confining layer including an oxidized region at a peripheral portion, a first electrode formed at a side of the first semiconductor multiple layer reflecting mirror, and a second electrode formed at a side of the second semiconductor multiple layer reflecting mirror, wherein the first electrode is electrically connected to the semiconductor layer of the first semiconductor multiple layer reflecting mirror.

4 Claims, 4 Drawing Sheets

SURFACE EMITTING SEMICONDUCTOR LASER AND METHOD OF MANUFACTURING THE SAME

BACKGROUND OF THE INVENTION

1. Field of the Invention

The present invention relates to a surface emitting semiconductor laser and a method of manufacturing the same, and more particularly, to a laser applied to a light source for an optical data processing and for a data recording.

2. Description of the Related Art

In the technical field of the optical communication and the optical recording, an interest to a surface emitting semiconductor laser (Vertical Cavity Surface Emitting Laser Diode, hereinafter referred to as VCSEL) has been increased in these years.

VCSEL has technical advantages that a threshold current is small, an optical spot of a circular shape can be easily obtained, and an evaluation at a wafer condition and two dimensional array of the light source can be achieved. "Small volume of the active region" causes the low threshold current while there is a trade off that a device resistance is dozens of to hundreds of Ohms, which is higher than that of an edge emitting semiconductor laser, and that obtaining a high optical output (not less than 10 mW) by itself is difficult.

The optical communication using an optical fiber has applied to a data transfer for a relatively middle or long distance (from several to dozens of kirometers). Typically, a combination of a single mode optical fiber and a Distributed-Feedback type (hereinafter referred to as DFB) laser is used. The DFB is oscillated at a wavelength range such 1.31 micron meter band or 1.55 micron meter band, which is a small distribution or loss in the optical fiber. They are used for communication associations who are referred to as a main line system and are main users and the production volume is not large compared with consumer products. It makes the price expensive. Furthermore, the system in itself has many problems of blocking a low price since it needs to control a device temperature and to take time for adjusting optical axes of the optical fiber and the laser.

These days, ADSL and CATV become widely used for families, and a high capacity data transfer, which is ten times to hundred times compared with the past, has been achieved. Increasing of the Internet user in future will be expected. Additionally, a demand for a high speed and a high capacity of data transfer will be enhanced and it is promising that many families will utilize the optical fiber in some day.

However, the combination of the single mode type of optical fiber and DFB laser for the middle/long distance, for example a few meters to dozens of meters of data transfer between home and an telegraph pole, is diseconomy. For the short distance communication (several to hundreds of meter), using a low cost optical fiber such as a multi-mode type of silica fiber or a plastic optical fiber (POF) is economical. Thus, the light source used for the multi-mode type of the optical fiber is required to be an affordable and not to need a particular an optical system and a driving system. VCSEL would be an option since it can satisfy with all above requirements.

VCSEL available at the present market is structurally classified into an ion-planting type and a selective-oxidation type. If the high speed response is required in the optical communication in future, latter type would be mainstream. VCSEL of this type has a strong effectiveness for optical confinement and provides excellent electrical-optical characteristics of a high efficiency and a low threshold current because a part of a semiconductor multiple layer reflecting mirror adjacent to an active region is selectively oxidized to form a refractive-index wave guide therein. Additionally a modulation band (3 dB down cut-off frequency) reaches at a few giga-herz even though a low bias current is a few milliampere, the response characteristics is excellent in the high speed modulation.

The leading role of the local area network (LAN) of an indoor network is Ethernet and its data communication rate starts at dozens of mega bit per second (Mbps) and has made a progress at hundreds of mega bit per second. Recently the rate of 1 giga bit per second (Gbps) has appeared and rate would get to hundreds Gbps in near future. Until 1 Gbps, an electric wiring using a twist pair cable can be applied, but it is considered that an optical wiring would take over it more than 1 Gbps because of a limit in the view of noise tolerance.

There is an aggressive trend to adopt VCSEL in the light source used for the optical wiring in the Ethernet of 10 Gbps and a development has been advanced. As explained above, there is no problem of the modulation at several GHz, but any measure is necessary to improve the response characteristics over 10 GHz.

A theoretical review of the modulation band for the semiconductor laser is disclosed in "Semiconductor Laser", Kenichi Iga, Ohmsha, 1990". 3 dB cut-off frequency ($f_{3\ dB}$), which is indication of the modulation band, is represented as formula (1)

$$f_{3dB} = \frac{1}{2\pi CR} \qquad (1)$$

Namely, the response characteristics depend on CR time constant. The above paper also explains that a relaxation-oscillation-frequency ($f_r$) which is a target of an improvement of the modulation band is conducted by formula (2) with a rate equation.

$$f_r = \frac{1}{2\pi}\sqrt{\frac{\xi G' P_{out}}{\eta_d h \omega_o V_m}} \qquad (2)$$

Where $\epsilon$ is optical confining coefficient, $G'$ is a derivation gain coefficient, $P_{out}$ is an optical output, $\eta_d$ is an external derivation quantum efficiency, $V_m$ is a mode volume of a resonator, h is a plank constant. Namely, it is understood that the relaxation-oscillation-frequency is increased proportion to a square root of the optical output.

As explained the above, it is understood that there are some points to be considered, such as a low capacitance, a low resistance and a high output power, for improving the modulation response of not only VCSEL but also the semiconductor laser From these standpoints, U.S. Pat. No. 5,343,487 discloses a preferable embodiment structure for improving the modulation response of VCSEL. This structure is known as an intra-cavity-contact structure. The lower and upper electrodes of different conductivity type are formed so as to sandwich an active region, their contacting positions are placed inside of the lower and upper multiple layer reflecting mirrors forming a resonator, therefore, this structure is referred to as the intra-cavity-contact structure.

In a prior art, VCSEL usually forms the electrode outside (substrate surface and its backside) of the resonator and an injection current passes through a multiple layer reflecting mirror (almost semiconductor), as the result an energy barrier generated in the multiple layer reflecting mirror causes an increase of series resistance and an operation voltage become high. Also, since the lower and upper electrodes are opposed in a plane parallel to the substrate, this forms a parallel plate capacitor and a parasitic capacitance is produced.

On the other hand, in the intra-cavity-contact structure as shown in U.S. Pat. No. 5,343,487, the current is passed through a part of the multiple layer reflecting mirror or is injected into the active region without passing, thus the increase of series resistance resulting from the multiple layer reflecting mirror can be inhibited and the parasitic capacitance resulting from the electrode can be eliminated.

Japanese Laid-Open Patent Application No. 2001-135890 discloses a structure for reducing a parasitic capacitance of a laser device for improving the modulation response of VCSEL. The laser device includes the upper and lower reflecting mirrors for making a resonator on a substrate, the active region sandwiched by the reflecting mirrors, the upper and lower contact layers with the high conductivity which are formed at the opposite side of the substrate from the view of the active region, the upper and lower electrodes formed on the upper and lower contact layers respectively and placed both sides from the view of the upper reflecting mirror in-plane direction, and the current guide structure having the opening for injecting the current to the relative narrow channel of the active region. The part of the lower contact layer which extends at below of the upper electrode has the relatively high resistance. In the preferred embodiment, the high resistance part does not extend inside edge of the upper contact layer which has the shape of "U" from the above view. That is, the resistance portion is patterned so that the high conductive region or the finger portion can be left along the inside edge of the electrode of "U" shape. According to this, the parasitic capacitance can be reduced considerably and the remarkable increase of the device resistance can be prohibited. Furthermore, the structure made of the upper and lower contact layers is asymmetric with respect to the axis of the resonator, the side where the upper electrode is formed is wider while the opposite side is narrower, which makes the parasitic capacitance reduced more effectively.

Japanese Laid-Open Patent Application No. 11-145560 relates to the surface emitting semiconductor laser using the selective oxidation of the AlAs layer or AlGaAs layer of the current confining layer. It discloses the technique for introducing the semiconductor multiple layer mirror served as the etching stop layer. It includes the compound semiconductor material having the phosphorous group or having at least one layer containing such material between the upper reflecting mirror 10 and the current confining layer 7, for stopping an etching accurately directly above the current confining layer 7. By using the etching stop layer 12, the etching can be stopped directly above the current confining layer correctly and the yield is also improved.

However, each structure disclosed in U.S. Pat. No. 5,343,487 and Japanese Laid-Open Patent Application No. 2001-135890 needs an advanced semiconductor technique in the manufacturing process, it means a reproducibility is poor and the device structure is not practical. Especially, the method by latter assumes the structure having a gain-waveguide that oxygen, fluorine, or helium is ion-implanted, and this structure may cause a low emission efficiency and characteristics fluctuations due to the difficulties in controlling a depth of ion-implantation. Furthermore, the structure disclosed by Japanese Laid-Open Patent Application No. 11-145560 is not the intra-cavity-contact structure, the resistance from each electrode to the upper and lower reflecting mirrors can not be suppressed. As explained the above, the conventional surface emitting semiconductor laser does not bring out the excellent features of a high efficiency and a low threshold current of the selective oxidation VCSEL, and an improved new structure has not been created yet, namely it is necessary that a device of a low capacitance, a low resistance, a high output power and a modulation response over 10 GHz can be manufactured easily in a good reproducibility.

SUMMARY OF THE INVENTION

The present invention has been made in view of the above circumstances and provides a selective oxidation type of VCSEL which satisfies with requirements of a low capacitance, a low resistance, and a high output simultaneously.

Furthermore, the present invention provides a surface emitting semiconductor laser and its manufacturing method for an improved intra-cavity-contact structure with a good reproducibility and a high yield.

The surface emitting semiconductor laser of the present invention includes an upper reflecting mirror and a lower reflecting mirror which sandwich an active layer over a main surface of a semiconductor substrate, and a layer interposed in the upper reflecting mirror whose peripheral portion is oxidized. The layer adjacent to the active layer in the lower reflecting mirror may be made of an Aluminum Gallium Indium Phosphide (AlGaInP) material group.

Also, the layer adjacent to the active layer may be made of Gallium Indium Phosphide (GaInP) and the first electrode is formed on the layer adjacent to the active layer in the lower reflecting mirror, and the second electrode is formed on the upper reflecting mirror. The first electrode is the intra-cavity structure where it contacts inside of the lower reflecting mirror, this makes a low resistance.

If AlGaInP has a particular composition ratio, it is known that AlGaInP is lattice-matched with an Aluminum Gallium Arsenide (AlGaAs) material group which is also lattice-matched with Gallium Arsenide (GaAs), thus an epitaxial growth is possible in triangular. Also there is the advantage in the manufacturing process that the selective etching can be easily performed between the AlGaInP material group and the Aluminum Gallium Phosphide (AlGaP) material group. Especially GaInP which does not contain Al among the AlGaInP material group has a preferable properties for the current injection type device. Namely, it is stable thermally, hard to be oxidized, and easy to make an ohmic contact.

The topmost layer of the lower reflecting mirror may be composed of GaInP and the n-side electrode is formed thereon, while the topmost layer of the upper reflecting mirror may be composed of AlGaAs, which is oxidized and served as the current confinement portion. Furthermore, GaAs may be laminated on the upper reflecting mirror and the p-side electrode may be deposited thereon.

By using such structure, the manufacturing process can be ease and the selective oxidation type VCSEL with the excellent modulation response for a high speed can be achieved even though it is the intra-cavity-contact structure.

Furthermore, the top of the lower reflecting mirror may be composed of the AlGaP material group and the GaInP layer may be laminated underneath of the top of the lower reflecting mirror, the Gallium Phosphide (GaP) layer may be laminated underneath of the upper reflecting mirror. The first electrode may be formed on the GaInP layer and the second electrode may be formed on the GaP layer.

Especially GaP which does not contain Al among the AlGaP material group has a preferable properties as a current injection type device. Namely, it is stable thermally, hard to be oxidized, and easy to make an ohmic contact.

The top of the lower reflecting mirror may be composed of AlGaP and it may be oxidized to form the current confining portion. Also, GaInP may be laminated below it and the n-side electrode may be formed thereon. Furthermore, GaP may be laminated the underneath of the upper reflecting mirror, and the p-side electrode of the annular shape may be formed thereon.

By this structure, the manufacturing process can be ease and the selective oxidation type VCSEL with the excellent modulation response for a high speed can be obtained.

According to an aspect of the present invention, a surface emitting semiconductor laser comprising a substrate; a first semiconductor multiple layer reflecting mirror formed on the substrate, the reflecting mirror having a semiconductor layer including at least Ga, In and P; an active region formed on the first semiconductor multiple layer reflecting mirror; a second semiconductor multiple layer reflecting mirror formed on the active region; a current confining layer formed between the first and second multiple layer reflecting mirrors, the current confining layer including an oxidized region at a peripheral portion; a first electrode formed at a side of the first semiconductor multiple layer reflecting mirror and a second electrode formed at a side of the second semiconductor multiple layer reflecting mirror, wherein the first electrode is electrically connected to the semiconductor layer of the first semiconductor multiple layer reflecting mirror.

According to another aspect of the present invention, a surface emitting semiconductor laser comprising a substrate; a first semiconductor multiple layer reflecting mirror formed on the substrate; a semiconductor conductive layer formed on the first semiconductor multiple layer reflecting mirror and including at least Ga, In and P; an active region formed on the semiconductor conductive layer; a second semiconductor multiple layer reflecting mirror formed on the active region; a current confining layer formed between the first and second multiple layer reflecting mirrors and including an oxidized region at a peripheral portion; a first electrode formed at a side of the first semiconductor multiple layer reflecting mirror; and a second electrode formed at a side of the second semiconductor multiple layer reflecting mirror wherein the first electrode is electrically connected to the semiconductor conductive layer.

According to another aspect of the present invention, a surface emitting semiconductor laser comprising a substrate; a first semiconductor multiple layer reflecting mirror formed on the substrate, the first semiconductor multiple layer reflecting mirror including a semiconductor conductive layer whose selective etching rate is different from other reflecting mirror; an active region formed on the first semiconductor multiple layer reflecting mirror; a lower semiconductor multiple layer reflecting mirror formed on the active region; a current confining layer formed between the first and second semiconductor multiple layer reflecting mirrors and including an oxidized region at a peripheral portion; a first electrode formed at a side of the first semiconductor multiple layer reflecting mirror; and a second electrode formed at a side of the second semiconductor multiple layer reflecting mirror, wherein the first electrode is electrically connected to the semiconductor conductive layer.

According to another aspect of the present invention, a surface emitting semiconductor laser comprising a substrate; a first reflecting mirror formed on the substrate, the first reflecting mirror including a first semiconductor conductive layer having at least Ga, In and P; an active region formed on the first reflecting mirror; a second reflecting mirror formed on the active region; a current confining layer formed between the first and second reflecting mirrors, the current confining layer including an oxidized region at a peripheral portion; a first electrode electrically connected to the first semiconductor conductive layer of the first reflecting mirror; and a second electrode electrically connected to a second semiconductor conductive layer which is placed at between the active region and the second reflecting mirror.

According to another aspect of the present invention, a method of manufacturing a surface emitting semiconductor laser comprising the steps of: laminating a plurality of semiconductor layers on a substrate, a plurality of semiconductor layers having a first semiconductor multiple layer reflecting mirror including a semiconductor layer containing at least Ga, In and P, a second semiconductor multiple layer reflecting mirror, an active region and a current confining layer between the first and second semiconductor multiple layer reflecting mirrors; etching the plurality of semiconductor layers to form a mesa on the substrate until the semiconductor layer containing at least Ga, In and P is exposed; oxidizing a peripheral portion of the current confining layer from a side of the mesa; forming an insulating film on the substrate including the mesa; and forming an opening in the insulating film at a bottom portion of the mesa and forming an electrode connected to the semiconductor layer containing at least Ga, In and P through the opening.

According to another aspect of the present invention, a method of manufacturing a surface emitting semiconductor laser comprising the steps of: laminating a plurality of semiconductor layers over a substrate, a plurality of semiconductor layer having a first mirror including a semiconductor layer containing at least Ga, In and P, a contact layer, an active region and a current confining layer between the first mirror and the contact layer; etching a plurality of the semiconductor layers to form a mesa on the substrate until the semiconductor layer containing at least GaInP is exposed; oxidizing a peripheral portion of the current confining layer from a side of the mesa; and forming a second mirror on a top of the mesa.

BRIEF DESCRIPTION OF THE DRAWINGS

Preferred embodiments of the present invention will be described in detail based on the following figures, wherein.

DESCRIPTION OF THE PREFERRED EMBODIMENTS

Figure 1A:
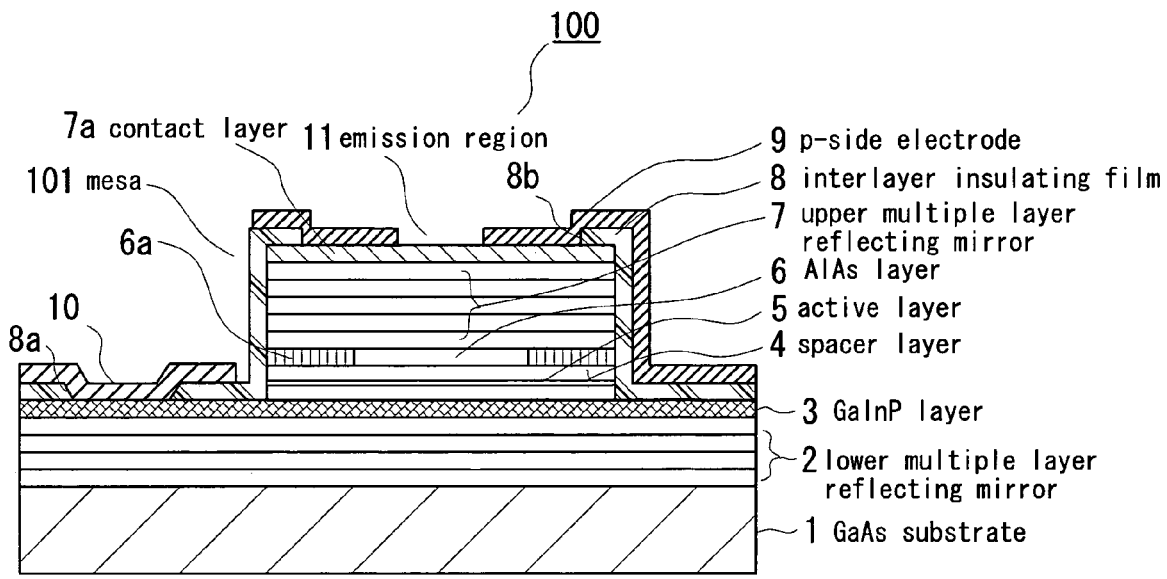
FIG. 1A shows a cross sectional view of a surface emitting semiconductor laser according to a first embodiment of the present invention.
Figure 1B:
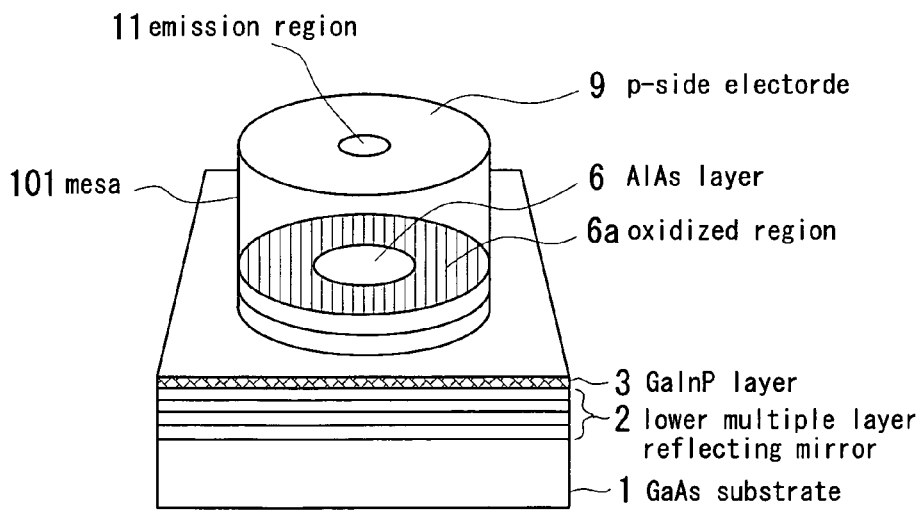
FIG. 1B shows a perspective view of a pattern diagram of FIG. 1A.

A description will now be given of a surface emitting semiconductor laser according to a first embodiment of the present invention. FIG. 1A shows a cross sectional view of the first embodiment and FIG. 1B shows a perspective view of a pattern diagram of FIG. 1A. Please note that FIG. 1B omits parts of a n-side electrode 10. Also, hereinafter chemical symbols (atomic symbol or chemical formula) is used to represent material names.

As shown in FIGS. 1A and 1B, a surface emitting semiconductor laser 100 sequentially laminates a lower multiple layer reflecting mirror 2, a GaInP contact layer 3, a spacer layer 4, an active layer 5, an Aluminum Arsenide (AlAs) layer 6, and an upper multiple layer reflecting mirror 7, over a GaAs substrate 1. The AlAs layer 6 is served as a current confining layer and includes an oxidized region 6a at a peripheral portion. The upper multiple layer reflecting mirror 7 includes a p-type contact layer 7a at a top thereof and a cylindrical mesa (or a post structure) 101 which extends from the contact layer 7a to the spacer layer 4 is formed. A side and the peripheral portion of the mesa 101 are covered with an insulating film 8 and an upper electrode (p-side) 9 is electrically connected to a contact layer 7a through a contact hole (opening) 8b at a top of the mesa 101. The upper electrode 9 has a shape of doughnut of which opening 8b is formed at a center, the opening 8b defines emission region 11 of the laser. The n-side electrode 10 is electrically connected to the GaInP contact layer 3 through a contact hole (opening) 8a of the insulating film 8 at a bottom of the mesa 101. The spacer layer 4 is placed directly above the GaInP layer 3.

The lower and upper multiple layer reflecting mirrors 2, 7 laminate respective reflecting mirrors of different reflection coefficient at plural cycles. In this embodiment, these reflecting mirrors are made of material of an AlGaAs material group. The GaInP layer 3 is placed on the top of the lower multiple layer reflecting mirror 2 as shown in FIG. 1A, however, it may be formed at the inside of the lower multiple layer reflecting mirror 2. Although the upper multiple layer reflecting mirror 7 includes the contact layer 7a, it is not necessary to include it.

The laser device structure in FIGS. 1A and 1B is the intra-cavity-contact structure because the n-side electrode 10 is placed in the middle of the resonator (the lower multiple layer reflecting mirror) in a vertical direction of the substrate 1. The lower multiple layer reflecting mirror 2 is not substantially utilized for a current path, thus the low series resistance and the low capacitance can be realized.

It is important what semiconductor material is contacted with the n-side electrode 10, for improving the performance and reproducibility of laser device. Because making the ohmic contact between the electrode and the semiconductor layer is preferable, however, the semiconductor material is thermally affected and easily transmuted and it may be oxidized at a room temperature in an atmosphere. Thus the ohmic contact may be difficult.

In the laser device structure according to this embodiment, the semiconductor layer which contacts with the n-side electrode 10 is the GaInP layer 3. GaInP can be grown by an epitaxial so as to be lattice-matched with the GaAs substrate 1 and the ohmic contact is easily made because GaInP is thermally stabilized and includes no Al which is easily oxidized.

In the present embodiment, one epitaxial growth is made to form the semiconductor layers until the upper multiple layer reflecting mirror 7 is formed. To form the n-side electrode 10, upper layers (the upper multiple layer reflecting mirror 7, the AlAs layer 6, the active layer 5 and the spacer layer 4) have to be removed by the etching until at least the GaInP layer 3 is exposed and the mesa 101 for forming the emission region 11 is left. The selective etching ratio is well above 1:10 in between the GaInP layer 3 and the GaAs/AlGaAs material group for forming the upper layers, thus the selective etching is possible. Accordingly, the GaInP layer 3 is etched until it is exposed in the mesa formation, and the mesa 101 can be easily and finely produced with a good reproducibility.

The intra-cavity-contact structure as shown in FIG. 1A may employ the GaAs layer or the AlGaAs layer for contacting with the n-side electrode 10 in stead of the GaInP layer 3. In case of using GaAs or AlGaAs, a selective etching ratio in between semiconductor layers is not enough to etch the mesa since both properties of GaAs and AlGaAs are similar as semiconductor materials. Therefore, the etching time is controlled in the formation of the mesa typically. However, the etching fluctuation is occurred and the equal exposure of the desired layer is difficult. Also, if two kinds of AlGaAs whose Al content ratio is different are laminated on the lower multiple layer reflecting mirror, it is imperative to expose AlGaAs with the higher Al content ratio due to an uneven etching. Thus, it is difficult to obtain the stabilized ohmic contact since the exposed surface is easily oxidized. On the contrary, the GaInP layer 3 which contacts with the n-side electrode 10 can solve the above problems, thereby the yield of the laser device being considerably improved.

In the intra-cavity-contact structure, the semiconductor layer (the GaInP layer in the present embodiment) which contacts with the electrode is placed at near the active region with respect to the vertical direction of the substrate. GaInP has a property of transparency when the oscillation wavelength is over 700 nm and there is no absorption of laser light. From this point, GaInP is best material to be selected.

Figure 2A:
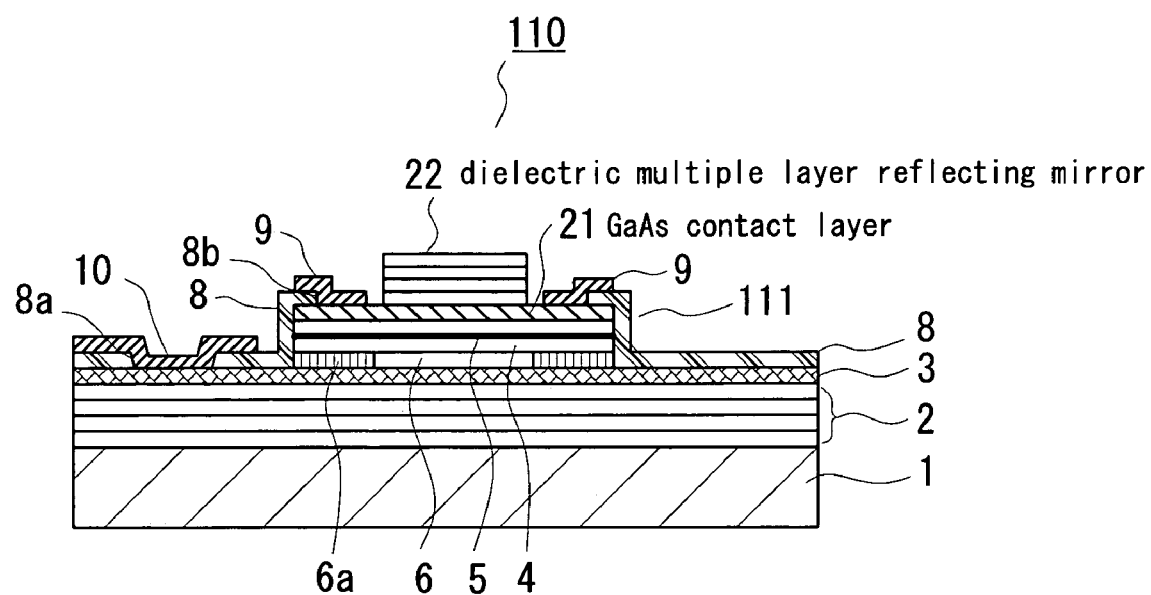
FIG. 2A shows a cross sectional view of a surface emitting semiconductor laser according to a second embodiment of the present invention.
Figure 2B:
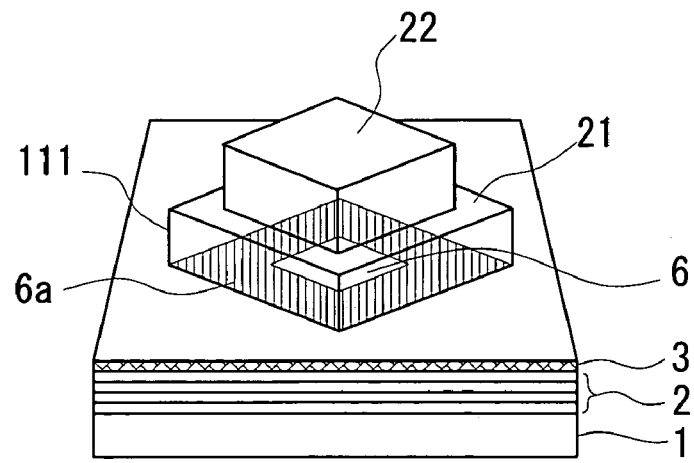
FIG. 2B shows a perspective view of a pattern diagram of FIG. 2A.

FIG. 2 shows VCSEL according to the second embodiment of the invention. FIG. 2A shows a cross sectional view of VCSEL, FIG. 2B shows a perspective view of pattern diagram of FIG. 2A. Please note that the n-side electrode 10 is omitted in FIG. 2B and same numbers are used for the same composition in FIGS. 1A and 1B.

The surface emitting semiconductor laser 110 includes the lower multiple layer reflecting mirror 2, the GaInP layer 3 placed at the top of the lower multiple layer reflecting mirror 2, the current confining layer 6, the spacer layer 4 including the active layer 5, a GaAs contact layer 21, and an upper multiple layer reflecting mirror 22, over the GaAs substrate 1. A mesa or a post 111 with a rectangular shape is formed and it is extended from the GaAs contact layer 21 to the current confining layer 6. The interlayer insulating film 8 covers the side and the bottom of the mesa 111. The p-side electrode 9 is electrically connected to the GaAs contact layer 21 through a contact hole 8b of the interlayer insulating film 8. The n-side electrode 10 is electrically connected to the GaInP layer 3, which is laminated in between the current confining layer (AlAs) 6 and the lower multiple layer reflecting mirror 2, through a contact hole 8a.

The second embodiment do not utilize not only the lower multiple layer reflecting mirror 2 but also the upper multiple layer reflecting mirror 22 as the current path although the first embodiment utilizes the part of the upper multiple layer reflecting mirror 7 as the current path. Thus the GaAs contact layer 21 which contacts with the p-side electrode 9 is deposited on the spacer layer 4 and the upper multiple layer reflecting mirror 22 is formed thereon.

In the laser device structure according to the second embodiment, the upper multiple layer reflecting mirror 22 is not served as the current path and the semiconductor layers are not required, therefore, a dielectric multiple layer reflecting mirror which enables to provide a high reflection coefficient with even smaller layers can be used.

One epitaxial growth made to form the semiconductor layers from the GaAs substrate 1 to the GaAs contact layer 21, and then the spacer layer 4, the active layer 5 and the AlAs layer 6 are etched until at least the GaInP layer 3 is exposed, thereby the mesa 111 being formed so as to leave the emission region.

By using the GaInP layer 3 contacting with the n-side electrode 10, the stabilized ohmic contact between them can be achieved and the fluctuation of the device characteristics is improved as well as the first embodiment. At the same time, since the p-side electrode 9 is contacted with the GaAs layer 21 over the spacer layer 4 in the second embodiment, the current path is deviated from the upper multiple layer reflecting mirror 22. It does not cause the increase of the series resistance due to the hetero barrier in the multiple layer reflecting mirror boundaries, as the result the intracavity-contact structure is made so that the current can be injected into the upper and lower regions sandwiching the spacer layer 4.

It is possible to use the GaInP layer which contacts with the p-side electrode 9 over the spacer layer 4. However, reactive gases or etchants used for etching the GaInP layer include materials which also etch AlGaAs of the spacer layer 4 placed below, and it is difficult to produce the selective etching ratio which depresses the etching rate of AlGaAs to a large extent. Accordingly the using of the GaAs layer 21 which contacts with the p-side electrode 9 and the GaInP layer 3 which contacts with the n-side electrode 10 is a good selection in manufacturing steps.

Figure 3A:
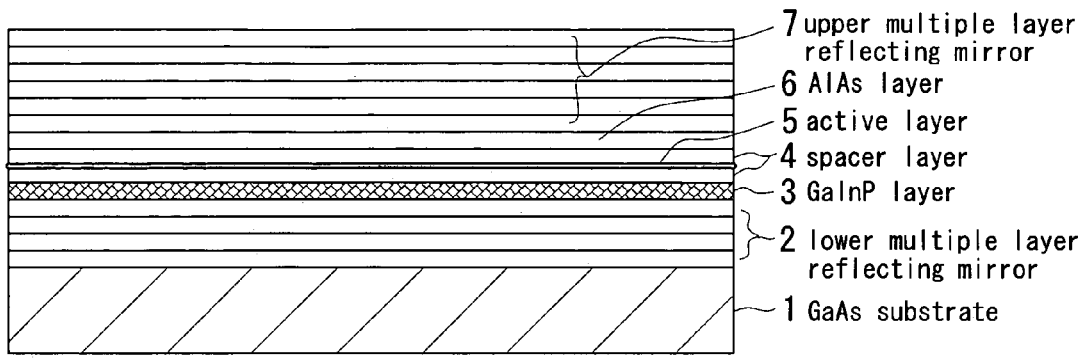
FIGS. 3A to 3C show cross sectional views of each manufacturing step for explaining the surface emitting semiconductor laser according to the first embodiment of the present invention.
Figure 3B:
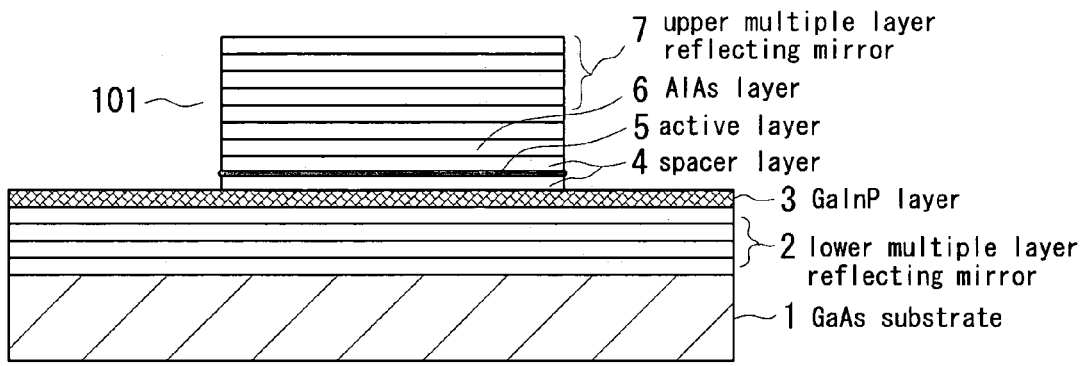
Figure 3C:
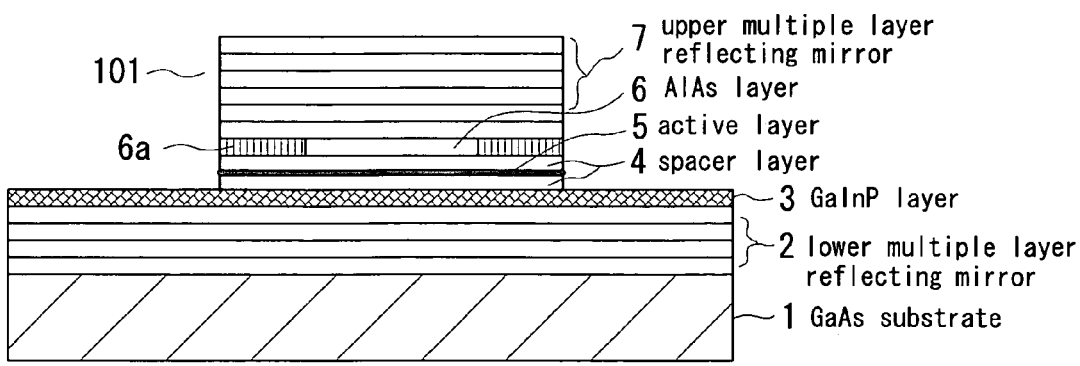

Next, VCSEL according to the first and second embodiments will be explained in detail refereeing to the drawings. FIG. 3A to 3C show the cross sectional views of each manufacturing step for explaining VCSEL. As shown in FIG. 3A, the lower multiple layer reflecting mirror 2 composed of lamination of plural layers of undoped $Al_{0.8}Ga_{0.2}As$ layers and undoped $Al_{0.1}Ga_{0.9}As$ layers, the GaInP layer 3 of n type, the spacer layer 4 of undoped $Al_{0.4}Ga_{0.6}As$ layer, the active layer 5 composed of a lamination of a barrier layer of undoped $Al_{0.2}Ga_{0.8}As$ and quantum well layer of undoped GaAs layer, the AlAs layer 6 of p type and the upper multiple layer reflecting mirror 7 composed of a lamination of plural layers of $Al_{0.8}Ga_{0.2}As$ of p type and $Al_{0.1}Ga_{0.9}As$ of p type, are sequentially deposited on a plane (100) of a semi-insulated GaAs substrate 1 by Metalorganic Chemical Vapor Deposition (MOCVD).

The lower multiple layer reflecting mirror 2 is made of the lamination of the undoped $Al_{0.8}Ga_{0.2}As$ and undoped $Al_{0.1}Ga_{0.9}As$, each layer is $\lambda/4n_r$ thick where $\lambda$ is emission wavelength, $n_r$ is refractive index of medium. The different composition crystal layers are alternately laminated by 36.5 pairs.

The GaInP layer 3 of n type is interposed for contacting with the second electrode as described later, a carrier concentration is $3\times10^{18}$ cm$^{-3}$ after silicon as n type impurity is doped.

The active layer 5, which is alternatively laminated by the quantum well active layer of undoped GaAs layer of 8 nm thickness and the barrier layer of undoped $Al_{0.2}Ga_{0.8}As$ of 5 nm thickness (note outside layer is the barrier layer), is placed at a center portion of the spacer layer 4 of undoped $Al_{0.4}Ga_{0.6}Ga$, and the spacer layer 4 including the quantum well active layer and the barrier layer is designed so that the film thickness of the spacer layer 4 is an integral multiples of $\lambda/n_r$. The active layer formed as above emits the light of 850 nm wavelength.

The upper multiple layer reflecting mirror 7 is composed of the lamination that the $Al_{0.8}Ga_{0.2}As$ of p type and the $Al_{0.1}Ga_{0.9}As$ of p type is laminated. Each layer is $\lambda/4n_r$ thick as well as the lower multiple layer reflecting mirror 2, the different composition crystal layers are laminated alternatively at 22 pairs. This cycle number includes the AlAs layer 6 placed at the bottom and the GaAs layer placed at the top. Please note that the material for making up the film thickness $\lambda/4n_r$ in the AlAs layer 6 is not necessary all of AlAs. If the AlAs layer is needlessly thick, a problem of an optical scattering loss would be occurred. Therefore the present embodiment selects the AlAs layer of 30 nm thickness and the rest is made of $Al_{0.9}Ga_{0.1}As$. The carrier concentration is $4\times10^{18}$cm$^{-3}$ after carbon as p type impurity is doped.

The reason why the periods (the number of pairs) of the upper multiple layer reflecting mirror 7 are fewer than that of the lower multiple layer reflecting mirror 2 is to make a deference of the reflectivity between them to take out the oscillated light from the upper side of the substrate. Details is not explained here but an intermediate layer having an intermediate Al composition ratio may be interposed between the $Al_{0.8}Ga_{0.2}As$ and $Al_{0.1}Ga_{0.9}As$ of the upper multiple layer reflecting mirror 7, for reducing a serial resistance of the device.

The top of the upper multiple layer reflecting mirror 7 is p type GaAs layer of 20 nm thickness. This improves the contact performance of the p-side electrode 9. The carrier concentration is $1\times10^{19}$cm$^{-3}$ after zinc as p type impurity is doped.

Next, the laser substrate is brought out from the growth chamber and a mask pattern of $SiO_2$ is formed using the photoresist process. Using $SiO_2$ as the mask, the etching is done for forming the cylindrical post or mesa as shown in FIG. 3B. The upper multiple layer reflecting mirror 7, the AlAs layer 6 and the spacer layer 4 including the active layer 5 are etched by the anisotropical etching. For example, a $H_2SO_4+H_2O_2+H_2O$ is used for the etchant. The selective etching ratio for AlGaAs and GaInP is at least 10 times. Making use of such selective etching ratio, the etching can be stopped precisely when the etching reaches the GaInP layer 3. This is because the etching rate come to be declined quickly. In this way, the side of the AlAs layer 6 over the spacer layer 4 is exposed. The AlAs layer 6 will be degenerated in the following oxidation step, it forms the oxidized region 6a at the peripheral portion, which is served to confine the current and light.

The substrate is then subjected to a steam atmosphere containing a nitrogen as a carrier gas (flow rate:2 little/min) at 350° C. for 30 minuets. The AlAs layer 6 forming the part of the upper multiple layer reflecting mirror 7 is oxidized. The oxidation rate of the AlAs layer 6 is significantly faster than that of $Al_{0.8}Ga_{0.2}As$ and $Al_{0.1}Ga_{0.9}As$, which also forms the part of the upper multiple layer reflecting mirror 7. As shown in FIG. 3C, the AlAs layer 6 is placed directly over the active layer 5 of the post 101, the oxidation is started from the side thereof. Eventually the shape of the oxidized region 6a is corresponded to the post shape. The oxidized region 6a is made to the current confining portion because of its low conductive. Simultaneously it is also served as the optical confining portion because of its high refractive index, which becomes an about half (~1.6) compared with circumferential semiconductor layers. The non-oxidized region is served at the current injection portion.

Subsequently, the insulating film is deposited on the entire surface of the substrate which includes the exposed side of the post. Then contact hole 8a, 8b are formed in the bottom and the top of the post respectively, and the interlayer insulating film 8 is formed.

Next, as shown in FIG. 1A, the n-side electrode 10 is patterned at the bottom of the post so as to make the electrical connection with the GaInP layer 3 through the contact hole 8a, and the p-side electrode 9 is patterned on the top of the post. The opening 11 is formed in the center of the p-side electrode 9 and defines the light emission. After the above steps, VCSEL according to the first embodiment as shown in FIG. 1A is obtained. The GaInP layer 3 which contacts with the n-side electrode 10 is broadened over the entire surface of the substrate and its potential is substantially same as the n-side electrode 10. As the result, a capacitive reactance between the n-side and the p-side electrodes 9, 10 may be produced. In order to minimize it, it is preferable that the GaInP layer 3 is electrically separated from an ambient portion except for the region needed for the current injection to the active layer 5. This region is a connecting portion of the lower part of the post and the n-side electrode 10. Therefore, besides such needed region, grooves which reach at the GaAs substrate 1 or the lower multiple layer reflecting mirror 2 may be formed by the etching for isolating the GaInP layer 3. Alternatively the proton injection may be used in stead of the grooves.

Meanwhile, if the n type GaInP layer 3 is formed as the part within the lower multiple layer reflecting mirror 2, the part of the lower multiple layer reflecting mirror 2 which is placed over the GaInP layer 3 is required to be doped at n type because the part works as the current path. Since the lower multiple layer reflecting mirror 2 is not served as the current path substantially, such undoped material is used in the embodiment. However, it may be composed of doped laminated mirrors regardless of its performance since the device operation is not affected by it. The lower multiple layer reflecting mirror 2 according to the present invention is not limited to the undoped and/or non-conductive laminated films.

Figure 4A:
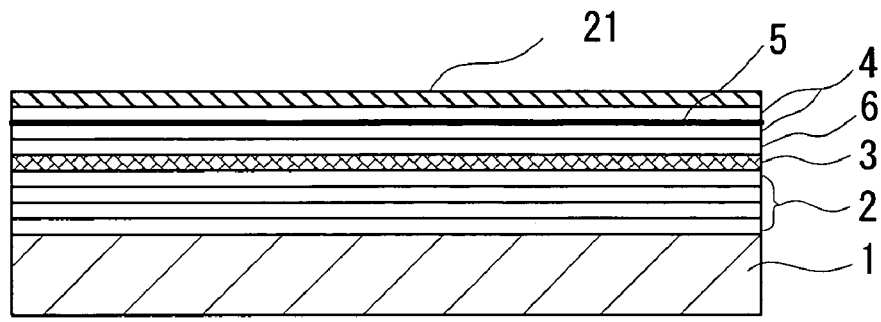
FIGS. 4A to 4C show cross sectional views of each manufacturing step for explaining the surface emitting semiconductor laser according to the second embodiment of the present invention.
Figure 4B:
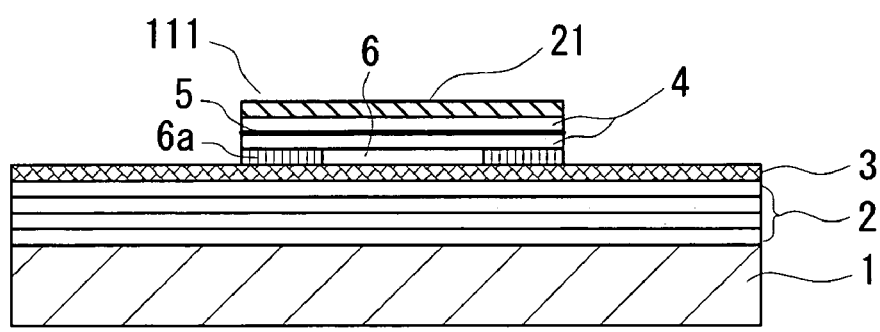
Figure 4C:
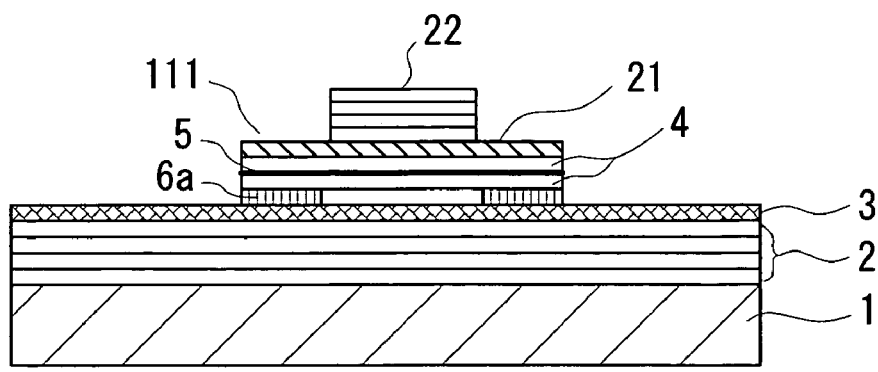

FIGS. 4A to 4C show cross sectional views of each manufacturing step for explaining VCSEL according to the second embodiment as shown in FIG. 2. In FIG. 4A, the lower multiple layer reflecting mirror 2 composed of lamination of plural layers of undoped $Al_{0.8}Ga_{0.2}As$ layers and undoped $Al_{0.1}Ga_{0.9}As$ layers, the GaInP layer 3 of n type, the AlAs layer 6 of n type, the spacer layer 4 of undoped $Al_{0.4}Ga_{0.6}As$ layer, the active layer 5 composed of a lamination of a barrier layer of undoped $Al_{0.2}Ga_{0.8}As$ and quantum well layer of undoped GaAs layer and a contact layer 21 of p type GaAs layer, are sequentially deposited on a plane (100) of the semi-insulated GaAs substrate 1 by Metalorganic Chemical Vapor Deposition (MOCVD). Hereinafter the explanation of the same semiconductor layers as the first embodiment will be omitted.

The AlAs layer of n type is 30 nm thickness and the carrier concentration is $3\times10^{18} cm^{-3}$ after the silicon as n type impurity is doped.

The GaAs layer of p type is 20 nm thickness and the carrier concentration is $1\times10^{19} cm^{-3}$ after the zinc as p type impurity is doped.

As shown in FIG. 4B, the substrate is took out from the reactor and then a rectangular mesa structure is formed. In this formation, a reactive ion etching (RIE) is performed and boron trichloride ($BCl_3$) and chlorine as an etchant gas may be used. The etching is controlled by the selective etching as well as the first embodiment, the etching is stopped accurately when the etching reaches to the GaInP layer 3. In this embodiment, the AlAs layer 6 is laminated on the GaInP layer 3, and the side of the AlAs layer 6 exposed by the mesa etching.

Next, the substrate is subjected to the oxidation process alike the first embodiment, the AlAs layer 6 is oxidized from the exposed side and it forms the current and light confining region 6a.

Subsequently, as shown in FIG. 4C, an upper multiple layer reflecting mirror 22 is formed on a top of the post 111. Please note that this step may be done before or after an electrode formation step described later. A dielectric multiple layer reflecting mirror of a lamination of plural layers, which composed of $TiO_2$ layer and $SiO_2$ layer, is deposited on the GaAs contact layer 21 of p type and then the upper multiple layer reflecting mirror 22 is formed at a center of the top of the post by using a lift-off process. Each layer is $\lambda/4n_r$ same as the first embodiment and two layers of different composition are alternatively laminated at 10 pairs. The upper multiple layer reflecting mirror 22 may cover at least the center portion of the substrate which emits the light. If the electrode formation step is done after the deposition of the upper multiple layer reflecting mirror 22, openings should be formed so that the respective semiconductor layers for contacting with the p-side and the n-side electrodes can be exposed.

Next, the p-side electrode 9 of an annular or half-annular shape is formed on the top of the post to make an electrical connection with the GaAs layer 21, and the n-side electrode 10 is formed on the bottom of the post to make an electrical connection with the GaInP layer, thereby VCSEL according to the second embodiment as shown in FIG. 2 being obtained.

The first embodiment exemplifies the upper and lower multiple layer reflecting mirrors 2, 7 made of semiconductor materials, and the second embodiment exemplifies the lower multiple layer reflecting mirror made of the semiconductor materials and the upper multiple layer reflecting mirror made of dielectric materials. However, the present invention is not limited to the above and allows to use other combination, which would generate same technical advantages without departing from the principle of operation.

In the first and second embodiments, a far side from the substrate is the p type and near side is n type from the active layer 5, however, the present invention is not limited to this, and such conductivity may be reversed.

The first and second embodiments adopt the structure that the emission light is took out from the upper side of the substrate, the present invention is not limited to this structure. A structure that the emission light is took out from the backside of the substrate can be applied if a wavelength band of the laser light is little absorbed in the substrate. In this case a recess may be formed at the backside of the substrate.

The first and second embodiments uses GaAs for the quantum well layer, however the present invention is not limited this material. Other material, for example, AlGaAs, InGaAs or GaInNAs etc, may be used for it.

In the first and second embodiments, the GaInP layer is used for the top of the lower multiple layer reflecting mirror 2, however the present invention is not limited to it. For example the AlGaInP layer including small quantity Al may be used.

Furthermore, in the first and second embodiments, the AlAs layer is used for the current/light confining layer after the oxidation step, the present invention is not limited to this. For example the AlGaAs layer including small Gallium may be used for it. Although the first embodiment interposes the current/light confining layer over the spacer layer and the second embodiment interposes it below the spacer layer, the interposed position may be selected by a manufacturing facility, and it is preferable that the current/light confining layer is interposed at least any one.

The preferable embodiment of the present invention is described above in detail, however, the present invention is not limited to the specifically disclosed embodiments, and other embodiments, variations and modifications may be made without departing from the scope of the present invention.

As explained the above, according to the present invention, the semiconductor conductive layer including at least Ga, In and P is formed within the first semiconductor multiple layer reflecting mirror or formed on the top, and the semiconductor conductive layer and the first electrode are electrically connected, consequently the feature of selective oxidation type VCSEL which has a excellent characteristics with the high efficiency and the low threshold current is brought out, thereby the low capacitance, the low resistance, the high output power, the modulation response over 10 GHz being achieved. Furthermore, the yield of the surface emitting semiconductor laser is improved by increasing the reproducibility of the laser, and low cost of laser can be supplied.

What is claimed is:

1. A surface emitting semiconductor laser comprising:
    a substrate;
    a first semiconductor multiple layer reflecting mirror formed on the substrate;
    a semiconductor conductive layer formed on the first semiconductor multiple layer reflecting mirror and including at least Ga, In and P;
    an active region formed on the semiconductor conductive layer;
    a second semiconductor multiple layer reflecting mirror formed on the active region;
    a current confining layer formed between the first and second multiple layer reflecting mirrors and including an oxidized region at a peripheral portion;
    a first electrode formed on a peripheral portion of the first semiconductor multiple layer reflecting mirror; and
    a second electrode formed at a side of the second semiconductor multiple layer reflecting mirror
    wherein:
    the surface emitting semiconductor laser has a mesa that extends from the second semiconductor multiple layer reflecting mirror to the semiconductor conductive layer, which serves as an etching stop layer;
    the current confining layer is formed in the mesa;
    the first electrode contacts the semiconductor conductive layer via an opening formed in an insulating film at a bottom of the mesa;
    the second electrode contacts the second semiconductor multiple layer reflecting mirror via another opening formed in the insulating film on the second semiconductor multiple layer reflecting mirror, and has an aperture for emission of laser light; and
    the first and second semiconductor multiple reflecting mirrors comprise Al, Ga and As.

2. The surface emitting semiconductor laser as claimed in claim 1, wherein the semiconductor conductive layer includes Al.

3. The surface emitting semiconductor laser as claimed in claim 1, wherein the first and second semiconductor multiple layer reflecting mirrors have a first and second conductivity type respectively and wherein the first and second semiconductor multiple layer reflecting mirrors have Al, Ga and As respectively.

4. The surface emitting semiconductor laser as claimed in claim 1, wherein a contact layer of a second conductivity type is formed on the second semiconductor multiple layer reflecting mirror and wherein the second electrode is electrically connected to the contact layer.

* * * * *